United States Patent [19]
Lin

[11] Patent Number: 5,854,124
[45] Date of Patent: Dec. 29, 1998

[54] METHOD FOR OPENING CONTACTS OF DIFFERENT DEPTHS IN A SEMICONDUCTOR WAFER

[75] Inventor: Benjamin Szu-Min Lin, Chia-Yi, Taiwan

[73] Assignee: Winbond Electronics Corp., Hsinchu, Taiwan

[21] Appl. No.: 881,775

[22] Filed: Jun. 24, 1997

[30] Foreign Application Priority Data

Feb. 4, 1997 [TW] Taiwan ................................. 86101355

[51] Int. Cl.$^6$ ............................................. H01L 21/4763
[52] U.S. Cl. ........................ 438/620; 438/637; 438/738; 438/976; 438/675; 438/970
[58] Field of Search .................... 438/637, 738, 438/976, 620, 675, 970

[56] References Cited

U.S. PATENT DOCUMENTS

| 4,933,297 | 6/1990 | Lu .............................................. | 437/41 |
| 5,006,484 | 4/1991 | Harada .................................... | 437/192 |
| 5,022,958 | 6/1991 | Favreau et al. ......................... | 156/643 |
| 5,026,666 | 6/1991 | Hills et al. ............................... | 437/195 |
| 5,269,879 | 12/1993 | Rhoades et al. ......................... | 156/643 |
| 5,547,892 | 8/1996 | Wuu et al. ................................. | 437/52 |
| 5,563,097 | 10/1996 | Lee .......................................... | 437/187 |
| 5,707,883 | 11/1998 | Tabara ....................................... | 437/40 |
| 5,707,901 | 1/1998 | Cho et al. ............................... | 438/595 |

Primary Examiner—John F. Niebling
Assistant Examiner—David A. Zarneke
Attorney, Agent, or Firm—Ladas & Parry

[57] ABSTRACT

A method for opening contacts of different depths in a semiconductor wafer after salicide processing. A sacrificial layer is formed over the wafer wherein the wafer further includes a first silicide layer and a second silicide layer formed thereon. The sacrificial layer is selectively removed such that only a portion of the sacrificial layer remains on the first silicide layer. An interlayer dielectric layer is formed over the wafer. The interlayer dielectric layer is planed. Contact windows are patterned. Contacts are opened to reveal the first silicide layer and the second silicide layer as contacts wherein the position where the first silicide layer is formed is higher than that where the second silicide layer is formed. Further, the thickness Y of the sacrificial layer is determined according to the following relation: $Y = \Delta X \times R_{SAC}/(R_{ILD} - R_{SAC})$, wherein $\Delta X$ is the height difference between the first silicide layer and the second silicide layer, and $R_{SAC}$ and $R_{ILD}$ are the etching rates of the sacrificial layer and the interlayer dielectric layer while being etched by the same etching matter respectively. Using the sacrificial layer prevents the contacts of shallower depths from being over etched and consequently the resistance of contacts in the shallower windows will not be increased abnormally due to being over etched.

14 Claims, 4 Drawing Sheets

METHOD FOR OPENING CONTACTS OF DIFFERENT DEPTHS IN A SEMICONDUCTOR WAFER

BACKGROUND OF THE INVENTION

1. Field of the Invention

The present invention relates to a method of semiconductor fabrication, and, in particular, a method for opening contacts of different depths.

2. Description of Related Art

Generally speaking, the process for fabricating a semiconductor device is based on a semiconductor substrate, wherein the device is formed by depositing different layers on the substrate and etching those layers. Thus, the profile of the device, in cross section, is ragged, inevitably resulting in the formation of contacts of different depth for other proceeding processes, such as metalization.

Etching contacts of different depths is common in semiconductor device processes, and is usually accomplished by fine-tuning selectivity. In deep sub-micrometer devices, when contact size is scaled down and a self-aligned silicide (salicide) process is implemented to form self-aligned contacts, an etching process window becomes quite narrow, resulting in either critical dimension deviation or substrate damage during the contact etching process.

A titanium salicide contact etching process is used as an example for illustration. FIGS. 1A through 1C, illustrate, in cross section, a contact etching process according to the conventional method. In FIG. 1A, a semiconductor wafer is first processed, for example, by a titanium salicide process. Next, after forming an interlayer dielectric (ILD), the wafer is globally planed by using chemical mechanical polishing (CMP) In FIG. 1A there is shown semiconductor substrate 1, field oxide 2, spacers 3, polysilicon line 4, titanium silicide (TiSi$_2$) layers 5, and inter-layer dielectric 6 after CMP. The wafer is then coated with photoresist and an etching window is defined by photolithography. After developing the photoresist, the results are shown in FIG. 1B, namely, photoresist 7 after developing, and a difference $\Delta X$ between the thickness of the ILD above the on-field-oxide TiSi$_2$ layer and that above the TiSi$_2$ layer formed on substrate 1. Then, after removing photoresist 7, anisotropical etching is used to etch the contacts. Referring to FIG. 1C, during the etching process, when the etching gases start to attack the on-field-oxide TiSi$_2$ layer in shallow contact 8, an ILD with a thickness of $\Delta X$ remaining for etching in deep contact 9. Consequently, when the etching of deep contact 9 reaches its etching stop (TiSi$_2$ on substrate 1), the on-field-oxide TiSi$_2$ and polysilicon line 4 are damaged by the etching gases, as shown in FIG. 1C, such that the damage of TiSi$_2$ and polysilicon line 4 causes unacceptable high contact resistance and degrades the performance. The situation is even worse since the silicide on top of doped polysilicon is usually thinner and more unstable than the silicide formed on active regions, and such contact etching traditionally has poor oxide selectivity with respect to self-aligned silicide such as TiSi$_2$.

SUMMARY OF THE INVENTION

Accordingly, an object of the present invention is to provide a method for opening contacts of different depths wherein, before opening contacts of different depths, sacrificial layers are selectively formed in the shallower contact windows. While etching contacts, because the rates for etching an ILD layer and a sacrificial layer are different, the time for the etching gas to open the deeper contacts will be equal to that to open the shallower ones by well controlling the thickness of sacrificial layers. Thus, the shallow contacts will not be over-etched.

To achieve the above object, a method for opening contacts of different depths in a semiconductor wafer after salicide processing is provided. A sacrificial layer is formed over the wafer wherein the wafer further includes a first silicide layer and a second silicide layer formed thereon. The sacrificial layer is selectively removed such that only a portion of the sacrificial layer remains on the first silicide layer. An interlayer dielectric layer is formed over the wafer. The interlayer dielectric layer is planed. Contact windows are patterned. Contacts are opened to reveal the first silicide layer and the second silicide layer as contacts; wherein the position where the first silicide layer is formed is higher than that where the second silicide layer is formed. Further, the thickness Y of the sacrificial layer is determined according to the following relation: $Y = \Delta X \times R_{SAC}/(R_{ILD} - R_{SAC})$, wherein $\Delta X$ is the height difference between the first silicide layer and the second silicide layer, and $R_{SAC}$ and $R_{ILD}$ respectively are the etching rates of the sacrificial layer and the interlayer dielectric layer while being etched by the same etching matter.

Using the sacrificial layer can prevent the contacts of shallower depths from being over etched and consequently the resistance of contacts in the shallower windows will not be increased abnormally due to being over etched.

DETAILED DESCRIPTION OF THE INVENTION

Referring to FIGS. 2A through 2D, the method for opening contacts of different depths according to the present invention is described in detail hereinafter.

Figure 1A:
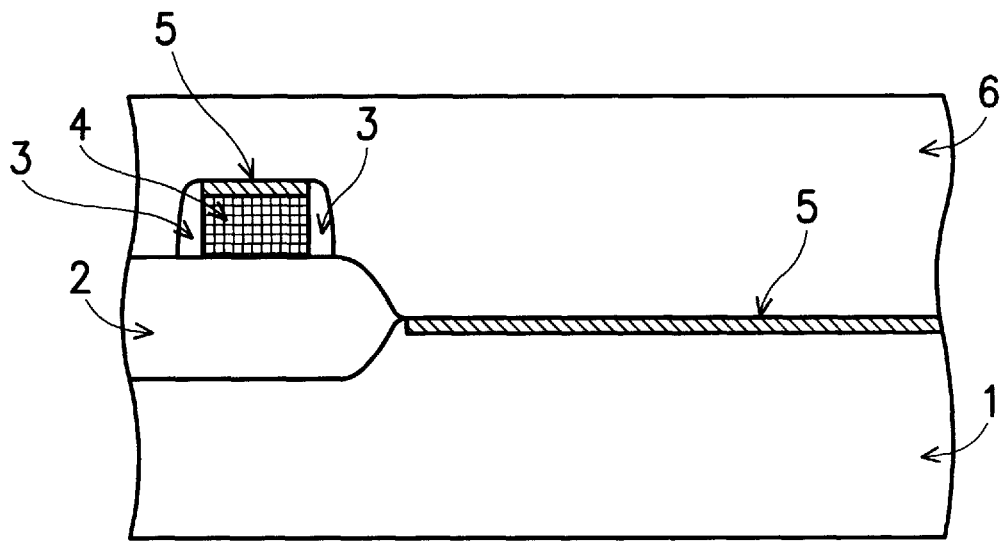
FIG. 1A through FIG. 1C schematically illustrate, in cross section, the method for opening contacts according to the prior art.
Figure 1B:
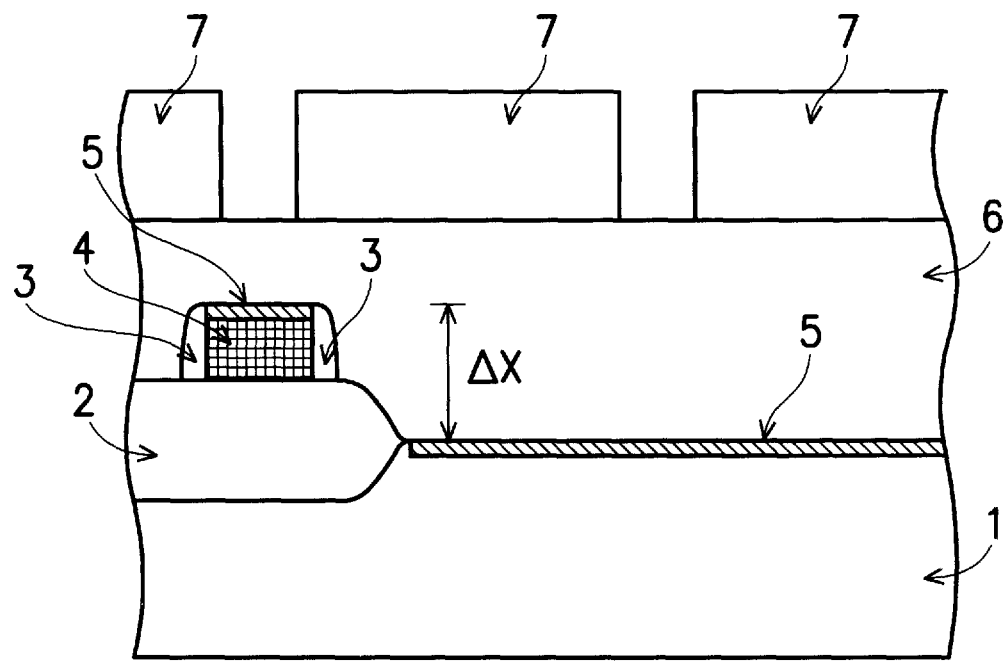
Figure 1C:
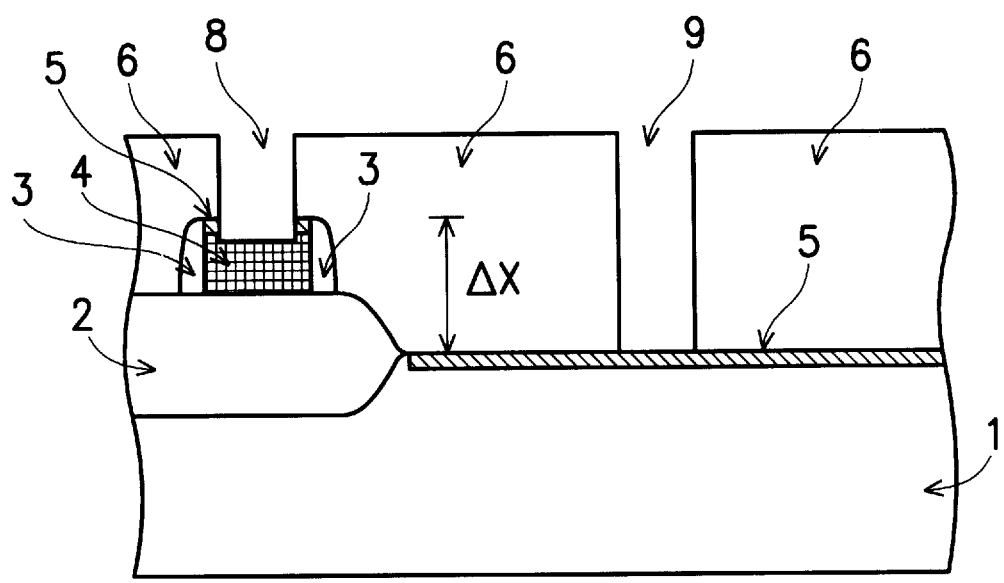
Figure 2A:
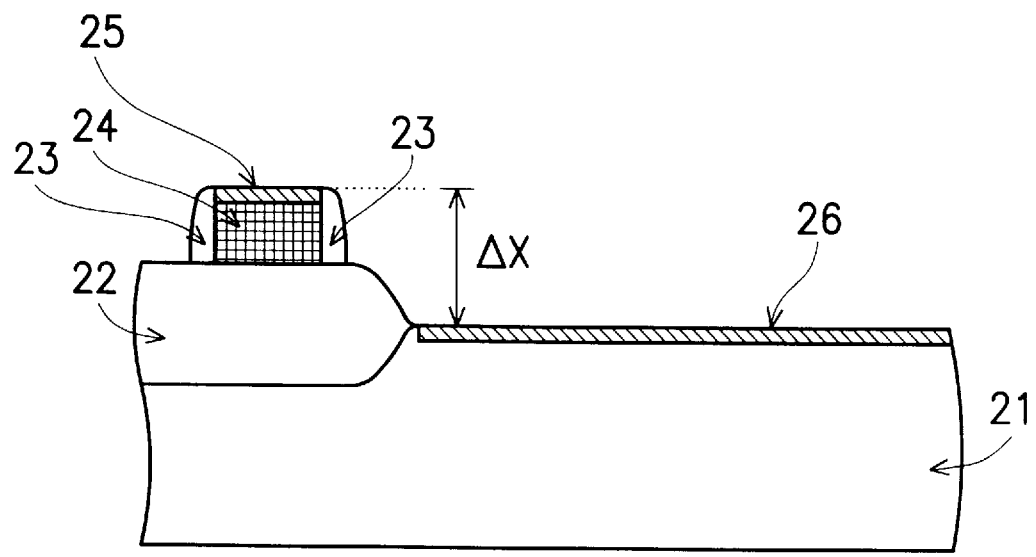
FIG. 2A through FIG. 2D schematically illustrate, in cross section, one preferred embodiment according to the present invention.

In FIG. 2A a semiconductor wafer after completing salicide process, such as titanium salicide, is illustrated in cross 22, spacers 23, polysilicon wire 24, first silicide layer 25 and second silicide layer 26 (TiSi$_2$). There is a height difference $\Delta X$ between the surfaces where first silicide layer 25 and second silicide layer 26 are formed.

Figure 2B:
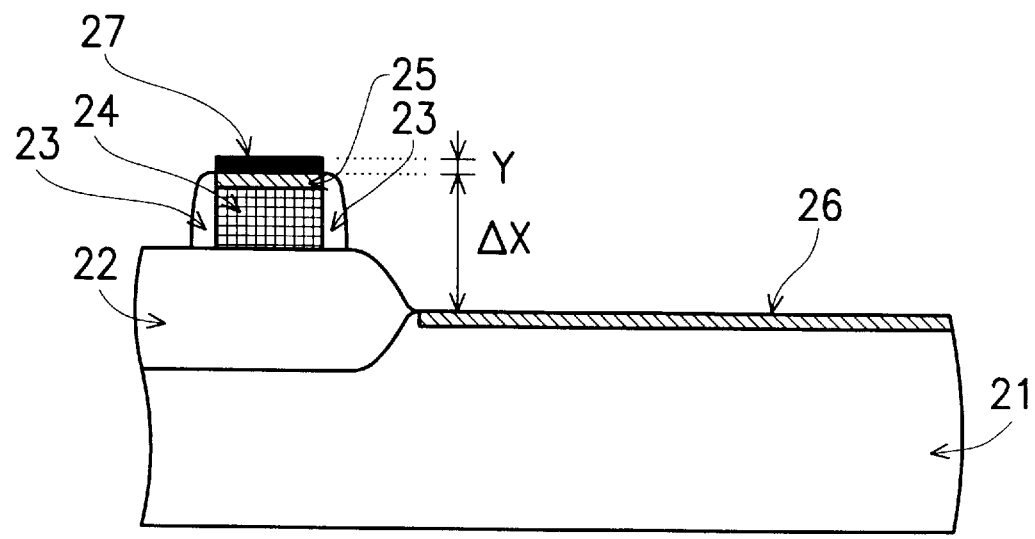

Next, referring to FIG. 2B, a layer of silicon and nitride compound SiN$_x$ is formed by using chemical-vapor deposition on the wafer as sacrificial layer 27. Sacrificial layer 27 has a thickness Y. The sacrificial layer is selectively etched and, therefore, only a portion of sacrificial layer 27 remains over first silicide layer 25.

Figure 2C:
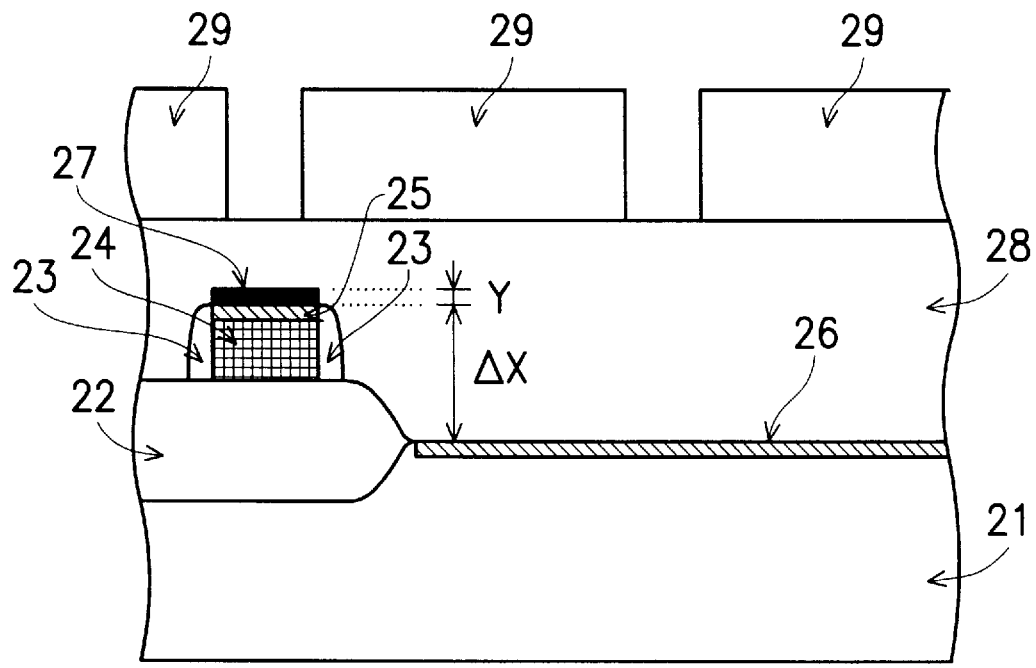
Figure 2D:
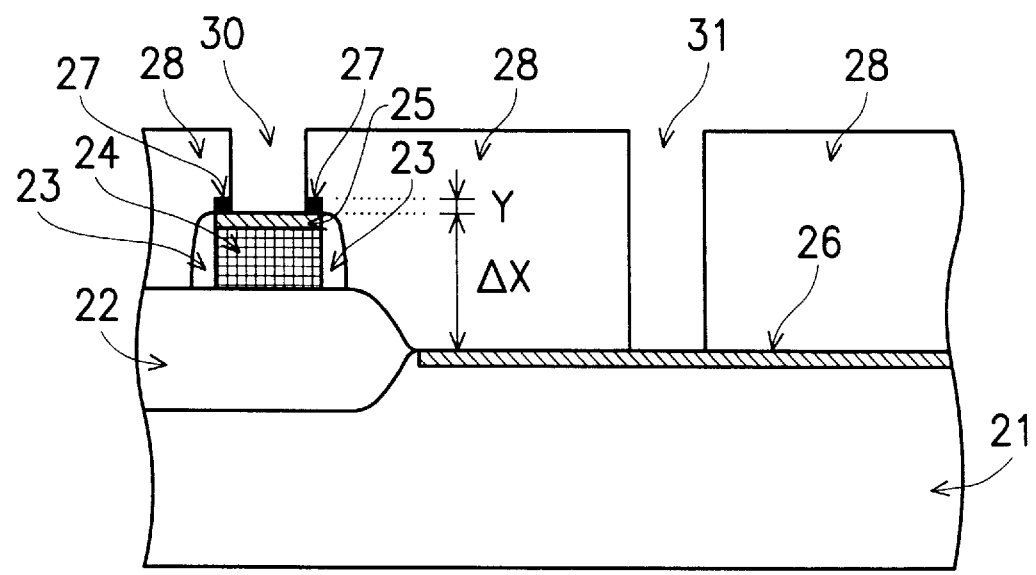

Referring to FIG. 2C, after etching sacrificial layer 27, interlayer dielectric layer 28 (TEOS) is formed over the wafer. TEOS layer 28 is globally planed by CMP. Photoresist layer 29 is formed over the wafer. The contact windows are patterned by using photolithography. The TEOS layer is then anisotropically etched for opening contacts by using etching gas, for example, an etching gas mixture of C$_4$F$_8$, CO, and Ar gases.

The principle for determining the thickness of the sacrificial layer 27 will be now be described in detail. Referring to again to FIG. 2C and to FIG. 2D, when the etching gas in shallow contact window 30 starts to etch sacrificial layer 27, the etching gas in the deeper contact window 31 must etch TEOS layer 28 with thickness of Y+ΔX to reveal second TiSi$_2$ layer 26. In order to prevent first TiSi$_2$ layer 25 in shallow contact window 30 from being over etched, when the etching gas sacrificial layer to a thickness of Y, the etching gas in deeper contact window 31 should have finished etching TEOS layer 28 to a thickness of Y+ΔX, thereby preventing the first TiSi$_2$ layer from being over etched. The etching rate of the same etching gas for etching sacrificial layer 27 and interlayer dielectric layer (TEOS) 28 are represented as R$_{SAC}$ and R$_{ILD}$ respectively. According to the above conditions, the etching rates and the sacrificial layer thickness Y and ΔX must conform to the following relation:

$$Y/(Y+\Delta X) = R_{SAC}/R_{ILD},$$

and consequently the thickness of the sacrificial layer 27 can be determined by the following numeral expression:

$$Y = \Delta X \times R_{SAC}/(R_{ILD} - R_{SAC}).$$

Based on the above embodiment, in general, ΔX is about 4000~5000 Å. The etching rate of the etching gas (a gas mixture of C4F8, CO, and Ar) for etching the sacrificial layer (SiN$_x$) is one third of that for etching the TEOS layer (that is R$_{SAC}$/R$_{ILD}$=1/3). When ΔX is 4000 Å, the thickness Y of the sacrificial layer (SiN$_x$) can be determined according to the above expression and Y is about 2000 Å. By using the sacrificial layer, the silicide resistance in a shallow contact window will not abnormally increased due to undergoing over etching.

Although the present invention has been described in terms of a preferred embodiments, it is anticipated that alternations and modifications thereof will no doubt become apparent to those skilled in the art. It is therefore intended that the following claims be interpreted as covering all such alternations and modifications as fall within the true spirit and scope of the invention.

What is claimed is:

1. A method for opening contacts of different depths in a semiconductor wafer after salicide processing, comprising the steps of:

forming a sacrificial layer over said semiconductor wafer wherein said semiconductor wafer further includes a first silicide layer and a second silicide layer formed thereon;

selectively removing said sacrificial layer such that only a portion of said sacrificial layer remains on said first silicide layer;

forming an interlayer dielectric layer over said semiconductor wafer;

planing said interlayer dielectric layer;

patterning contact windows; and opening contacts to reveal said first silicide layer and said second silicide layer as contacts;

wherein a first position where said first silicide layer is formed is higher than a second position where said second silicide layer is formed.

2. The method as in claim 1, wherein a thickness Y of said sacrificial layer is determined according to the following relation:

$$Y = \Delta X \times R_{SAC}/(R_{ILD} - R_{SAC}),$$

wherein ΔX is a height difference between said first silicide layer and said second silicide layer, and R$_{SAC}$ and R$_{ILD}$ are respective etching rates of said sacrificial layer and said interlayer dielectric layer while being etched by a same etching matter.

3. The method as in claim 1, wherein said sacrificial layer consists of silicon and nitride.

4. The method as in claim 1, wherein said sacrificial layer is a TiN layer.

5. The method as in claim 1, wherein said interlayer dielectric layer is a TEOS layer.

6. The method as in claim 1, wherein said sacrificial layer is formed by chemical-vapor deposition (CVD) method.

7. The method as in claim 1, wherein said contacts are formed by using anisotropical etching method having etching gas mixture of C$_4$F$_8$, CO, and Ar gases.

8. A method for opening contacts of different depths in a semiconductor wafer after titanium salicide processing, comprising the steps of:

forming a sacrificial layer over said semiconductor wafer wherein said semiconductor wafer further includes a first TiSi$_2$ layer and a second TiSi$_2$ layer formed thereon;

selectively removing said sacrificial layer such that only a portion of said sacrificial layer remains on said first TiSi$_2$ layer;

forming an interlayer dielectric layer over said semiconductor wafer;

planing said interlayer dielectric layer;

patterning contact windows; and opening contacts to reveal said first TiSi$_2$ layer and said second TiSi$_2$ layer as contacts;

wherein a first position where said first TiSi$_2$ layer is formed is higher than a second position where said second TiSi$_2$ layer is formed.

9. The method as in claim 8, wherein a thickness Y of said sacrificial layer is determined according to the following relation:

$$Y = \Delta X \times R_{SAC}/(R_{ILD} - R_{SAC}),$$

wherein ΔX is a height difference between said first TiSi$_2$ layer and said second TiSi$_2$ layer, and R$_{SAC}$ and R$_{ILD}$ are respective etching rates of said sacrificial layer and said interlayer dielectric layer while being etched by a same etching matter.

10. The method as in claim 8, wherein said sacrificial layer consists of silicon and nitride.

11. The method as in claim 8, wherein said sacrificial layer is a TiN layer.

12. The method as in claim 8, wherein said interlayer dielectric layer is a TEOS layer.

13. The method as in claim 8, wherein said sacrificial layer is formed by chemical-vapor deposition (CVD) method.

14. The method as in claim 8, wherein said contacts are formed by using anisotropical etching method having etching gas mixture of C$_4$F$_8$, CO, and Ar gases.

* * * * *